United States Patent [19]
Jensen

[11] Patent Number: 4,600,886
[45] Date of Patent: Jul. 15, 1986

[54] APPARATUS FOR ORIENTING A MAGNETOMETER

[75] Inventor: Homer Jensen, Elkins Park, Pa.

[73] Assignee: Litton Industries, Inc., Beverly Hills, Calif.

[21] Appl. No.: 474,682

[22] Filed: Mar. 11, 1983

[51] Int. Cl.⁴ .............................................. G01R 33/08
[52] U.S. Cl. .................................. 324/301; 324/304
[58] Field of Search ............... 324/301, 302, 330, 331, 324/344, 345, 348, 244, 245, 246, 260, 261; 33/361; 74/86; 350/567, 568, 6.2, 6.9; 343/765, 766, 769

[56] References Cited

U.S. PATENT DOCUMENTS

| | | | |
|---|---|---|---|
| 2,335,286 | 11/1943 | Klemperer | 350/567 |
| 2,468,554 | 4/1949 | Hull | 324/246 |
| 2,555,209 | 5/1951 | Vacquier | 324/246 |
| 3,701,005 | 10/1972 | Hartline | 324/301 |
| 3,765,687 | 9/1971 | Weiss | 277/8 |

Primary Examiner—Michael J. Tokar
Assistant Examiner—R. Raevis
Attorney, Agent, or Firm—Elliott N. Kramsky

[57] ABSTRACT

A system for measuring the earth's magnetic field includes a magnetometer and apparatus for maintaining a predetermined magnetometer tilt in the magnetic meridional plane regardless of changes in vehicle heading. The magnetometer is of the type whose optimum measurement sensitivity is defined by a cone of predetermined angle that is symmetric about its optical axis. It is engaged to a planar platform by gimbal apparatus forming orthogonal axes of rotation that cooperates with a rotatable hemispherical strip to allow the magnetometer to be continuously repointed during changes in the heading of a carrier vehicle so that it is maintained in the magnetic meridional plane at a predetermined tilt angle.

12 Claims, 3 Drawing Figures

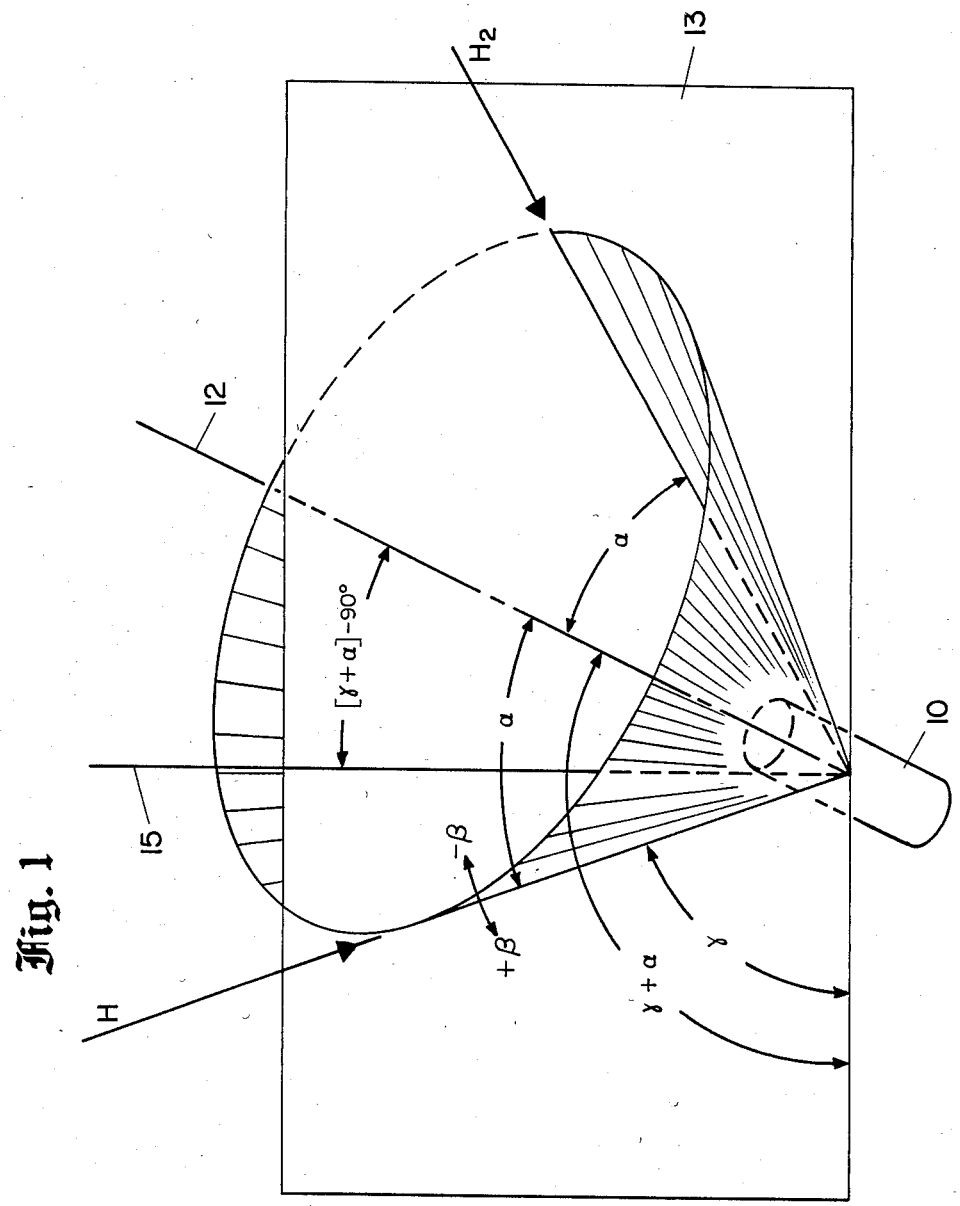

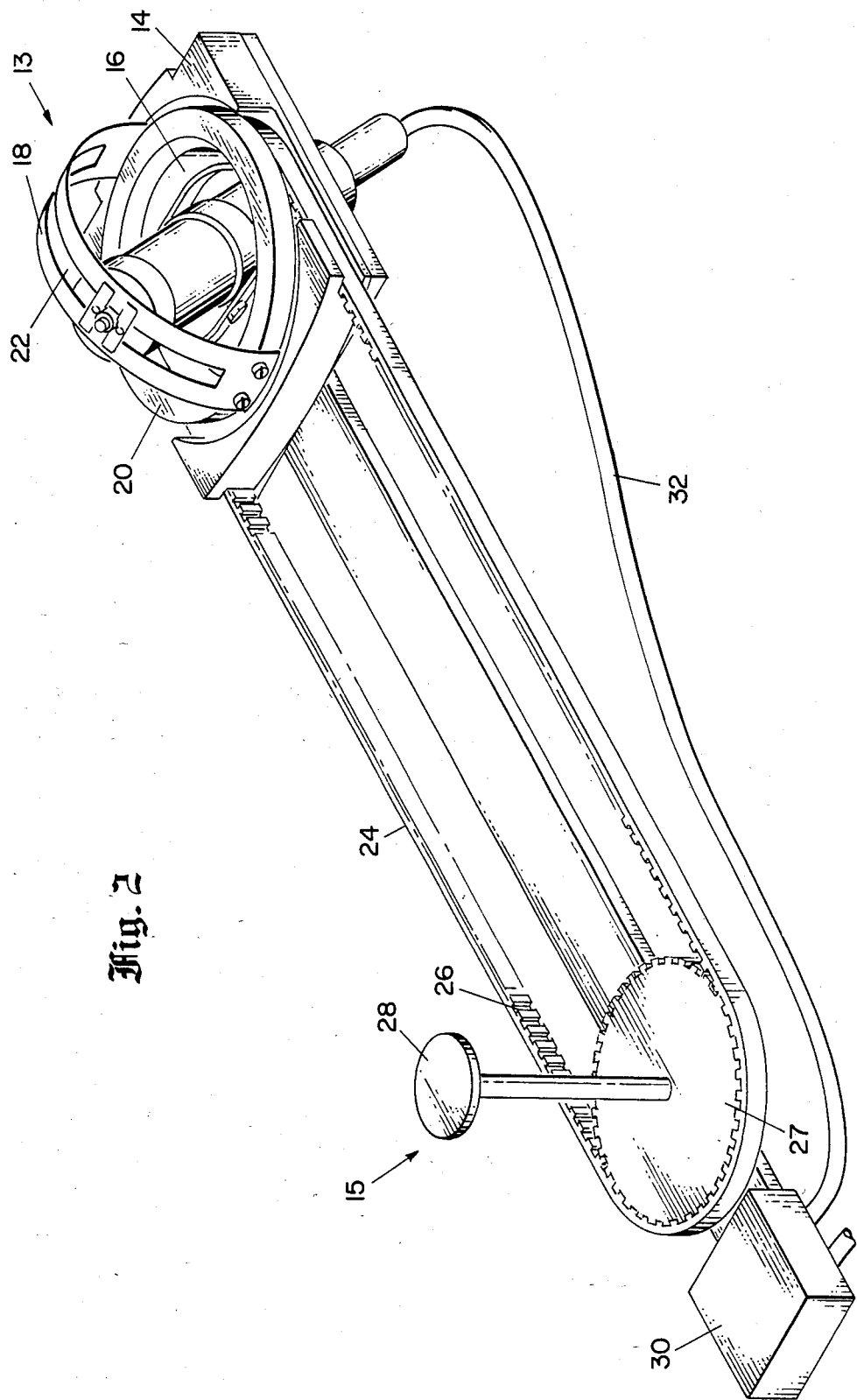

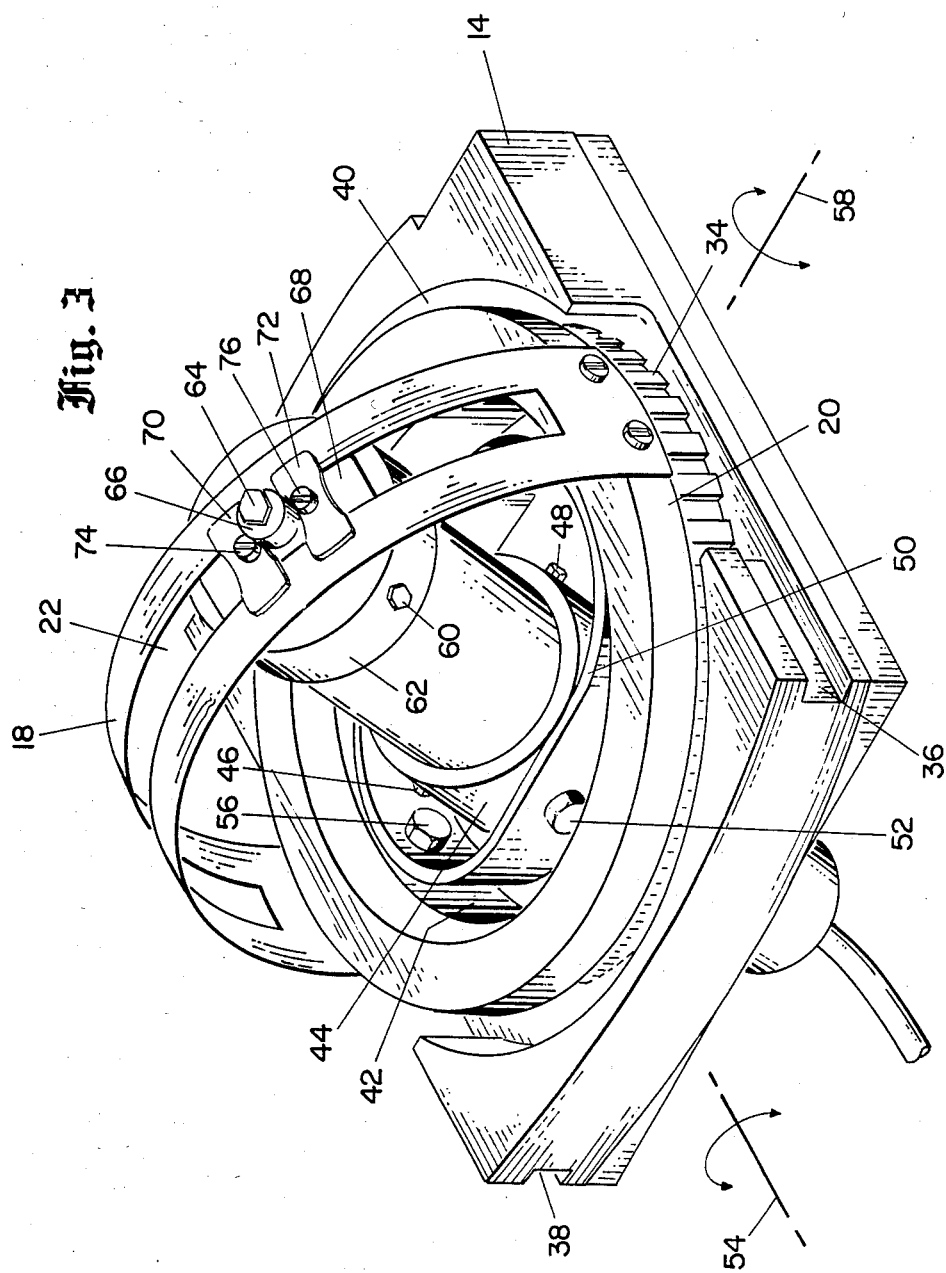

APPARATUS FOR ORIENTING A MAGNETOMETER

BACKGROUND OF THE INVENTION

1. Field of the Invention

The present invention relates to apparatus for measuring the earth's magnetic field. More particularly, this invention pertains to apparatus for continuously orienting a magnetometer in such a way that the magnitude of a local magnetic field may be measured with maximum magnetometer sensitivity.

2. Description of the Prior Art

In recent years the optically pumped magnetometer has been widely used as a magnetic field sensing device, capable of highly accurate measurement (on the order of one part per million or better) of the earth's field. This instrument utilizes quantum mechanical effects to produce an output frequency responsive to the magnitude of the local magnetic field. While its principles of operation and details of construction are well known, it is to be noted that the instrument includes a sample vapor, usually cesium, through which a beam of light (known as a "pumping beam"), defining the optical axis of the magnetometer, is transmitted.

It is a characteristic of the single cell optically pumped magnetometer that the accuracy with which the magnitude of magnetic field is sensed is a function of the angular orientation of the instrument with respect to the local magnetic field. Commonly, optimum measurement accuracy is achieved when the optical axis of the device is oriented 45 degrees with respect to the local magnetic field vector. Thus the locus of optimum detection for such device consists of a cone of half angle of 45 degrees centered about the optical axis of the magnetometer. The alignment of the local magnetic field vector with any element of this cone satisfies the optimum detection relationship for the instrument.

In mapping the earth's magnetic field and in numerous other applications, the magnetometer is associated with a moving platform, such as an airplane, which will generally traverse a selected area in a preselected pattern. Thus, the magnetometer must be continuously reoriented throughout the mapping process to achieve an output of uniform sensitivity and accuracy. Numerous approaches to the orientation problem have been attempted. In one, six separate magnetometers are arranged along three axes that, in turn, are so arranged that the total field vector moves angularly with respect to the axes. In such manner, the measurement task moves successively from pair to pair along the axes, allowing the field vector to maintain a tolerable, though not optimum, angular relationship with at least one cell pair at all times. This produces an essentially omnidirectional axis of sensitivity. Such configuration, while eliminating the need for a magnetometer orientation mechanism, is characterized by high costs of both manufacture and maintenance that result from the sixfold redundancy required of many of the system's components.

Various orientation systems utilize gimbal-type apparatus. Included among these are two systems marketed by Varian Associates. In one, a selected ray of the aforementioned cone of the magnetometer is maintained in an approximately optimal orientation with respect to the local magnetic field by manual rotation of the gimbals. The repointing of the magnetometer twists it about its axis. Such an orientation system is hindered in operation by relatively stiff cables normally associated with the magnetometer which require the application of substantial torquing forces to effect such twisting of the magnetometer. In a second system, a three axis gimbal is driven by a closed loop servomechanism that senses the direction of the earth's magnetic fields by analyzing the effects of an added, cyclically varied magnetic field. The servomechanism orients the appropriate gimbal to maintain alignment of the optical axis along the field direction. Although this apparatus provides high accuracy measurements, it is expensive, heavy and bulky, the cost of the orientation system being an order of magnitude greater than that of the magnetometer which it supports.

SUMMARY OF THE INVENTION

The foregoing and additional shortcomings of the prior art are overcome by the present invention wherein there is provided apparatus for measuring the magnitude of the earth's magnetic field. Such apparatus includes a magnetometer having an optical axis, the maximum measurement sensitivity of such magnetometer being defined by a cone of predetermined angle which is symmetric about such axis. A planar platform having an aperture accommodates the magnetometer. Means are provided for engaging the magnetometer to the platform, such means forming orthogonal axes of rotation. There is further provided means for tilting the magnetometer in a magnetic meridional plane so that the magnitude of a local magnetic field is measured with maximum sensitivity.

In an additional aspect, the invention comprises apparatus for positioning a magnetometer. The apparatus includes a planar platform having an internal aperture. Means are provided for engaging a magnetometer to the platform so that there are formed orthogonal axes of rotation. Means are further provided for tilting a magnetometer in the magnetic meridional plane so that the magnitude of the local magnetic field may be measured with maximum sensitivity.

The above and additional features of the invention will be best understood from the detailed description which follows. This description accompanies a set of drawing figures including numerals, corresponding to numerals of text of the detailed description, that identify the various features of the invention. In the text and in the description, like numerals refer to like features throughout.

BRIEF DESCRIPTION OF THE DRAWINGS

FIG. 1 is a schematic representation of an optically pumped magnetometer of the type employed in conjunction with the present invention showing the characteristic cone angle of measurement sensitivity.

FIG. 2 is a perspective view of apparatus of the overall system for orienting a magnetometer in accordance with the present invention; and FIG. 3 is an enlarged perspective view of the positioner of the system for orienting a magnetometer.

DETAILED DESCRIPTION

Referring now to the drawings, FIG. 1 is a schematic view of an optically-pumped magnetometer 10 in accordance with and for use in the present invention. In this figure, the magnetometer is shown to be oriented with respect to the local magnetic field vector H so that maximum magnetometer sensitivity to the magnitude of the field is achieved.

The field vector H lies in the magnetic meridional plane 13 defined by the vector H and the local vertical 15. Maximum measurement sensitivity is obtained when the angle between the optical axis 12 of the magnetometer 10 and the H vector in the plane 13 is 45°. To achieve such angular separation, the magnetometer 10 is inclined from the horizontal by an angle $\gamma + \alpha$, where $\gamma$ is the inclination of the field vector from the horizontal, and $\alpha$ is 45°. By subtraction of 90°, the complement of the angle $(\gamma + \alpha)$ is obtained, which is the angle of tilt or "nutation" of the detector axis from the local vertical that corresponds with the angle of optimum detection. This angle can be seen in FIG. 1 as the tilt angle of the detector axis 12. [In this discussion, "inclination" is the angle from horizontal, and "tilt" is the angle from the vertical.] For inclination angles of the field vector less than 45° from the horizontal, the geometry of the second vector in FIG. 1, $H_2$, will apply. Thus, it will be seen that tilt angles of the detector axis 12 need never exceed 45° to achieve optimum orientation, regardless of the inclination angle.

The magnetometer may be a model VIW2321G3 manufactured by Varian Associates of Palo Alto, Calif. Such an instrument provides satisfactory magnetic mapping accuracy within the cone angle $\alpha = 45 \pm \beta$ where $\beta$ equals 5°. Furthermore, there is some indication, via magnetometer test measurements, that the variation in cone angle can be as high as $\beta = \pm 8\frac{1}{2}$ degrees. At such permitted variation in cone angle, a vehicle carrying magnetometer 10 may pitch and roll at angles of somewhat more than 5° with little or no lessening in accuracy of magnetic field measurement. A polarity reversal switch on the magnetometer 10 (not shown) allows the operator to reverse the active zone to accomodate a field vector whose polarity is reversed from that shown on FIG. 1.

FIG. 2 is a perspective view of the complete system for orienting the magnetometer 10 in accordance with the invention. The apparatus shown in this view, including a positioner 13 and a driver 15, may be mounted onto an aircraft or other vehicle for the purpose of conducting mineral exploration, for example. Referring first to the positioner 13, the magnetometer 10 is secured through an arrangement of gimbal rings (not shown) that define orthogonal axes of rotation, to a support platform 14 at a circular aperture 16 provided therein. A hemispherical strip 18, affixed to a ring-like base 20, is rotatably mounted to the platform 14. The upper end of the magnetometer 10 is slideably fixed within a guide slot 22 that extends substantially the length of the hemispherical strip 18.

The ring-like base 20 includes a plurality of circumferentially-arranged gear teeth (not shown). A U-shaped channel is provided within the platform 14 that allows passage therethrough of a drive belt 24 having a plurality of inwardly-projecting teeth 26 for meshing with the teeth associated with the base 20. Thus, the ring-like base 20 and the hemispherical strip 18 will rotate about an axis perpendicular to the plane of the support platform 14 in response to the drive belt 24. The drive belt 24 is, in turn, responsive to the rotation of a drive gear 27 of the driver 15 that is controlled by an azimuth indexing wheel 28. The wheel 28 can be either manually or electromechanically controlled on a continuous basis by numerous means including but not limited to servomechanisms or the like. In operation, rotation of the wheel 28, and consequent rotation of the hemispherical strip 18, serve to maintain the guide slot 22 of the strip 18 within the magnetic meridional plane of the local magnetic field irrespective of vehicle heading. As a consequence, one may be assured that the preferred angle of approximately 45° exists between the local field vector and the optical axis 12 since a pair of rays of the cone of maximum measurement sensitivity of the magnetometer 10 have a preselected orientation in the plane that includes the guide slot 22 that is set by the "tilt" of the magnetometer 10 within the hemispherical strip 18.

Electrical signals indicative of magnetic field intensity are transmitted from the magnetometer 10 to a preamplifier 30 over a relatively stiff conductor cable 32. It is a central feature of the orientation apparatus of the present invention that the torquing force required to orient the magnetometer 10 as aircraft heading changes is relatively minimal since the orientation apparatus allows the magnetometer to be continuously repointed (via rotation of the hemispherical strip 18) without twisting or rotating the instrument about its longitudinal (optical) axis. Rather, as will be seen in FIG. 3, a system of two gimbal rings that connects the magnetometer 10 to the platform 14, allows a sufficient range of movement of the magnetometer to permit it to be continuously repointed without incurring the undesired twisting, and the consequently large resistance of the cable 32 thereto, discussed above. An additional advantage in the avoidance of twisting of the cables is that orientation of the magnetometer may proceed in any sequence without requiring "unwinding" of the cable to overcome the effects of a series of turns in the same direction.

FIG. 3 is an enlarged perspective view of the positioner 13 of the orientation apparatus. In this view, a number of essential features of the positioner 13 can be seen which were not visible in the preceding view. Gear teeth 34 are seen to be associated with the lower portion of the ring-like base 20. As mentioned above, the gear teeth 34 engage teeth 26 fixed to the inner side of the drive belt 24 so that the angular position of the hemispherical strip 18 and guide slot 22 is responsive to rotation of the drive gear 27. The U-shaped channel of passage of the drive belt 24 through the support platform 14 for engaging and thereby rotating the base 20 is seen to include opposed entry slots 36 and 38 in combination with a semicircular portion 40 of the clearance existing between the platform 14 and the ring-like base 20.

The interior 42 of the aperture 16 of the platform 14 is independent of rotation of the base 20, forming the inner portion of a channel in which the base 20 is rotatable. A magnetometer holder ring 44 is fixed to the magnetometer 10 by opposed clamping screws 46 and 48 and rotatably secured to the opposed elongated side portions of an oblong gimbal ring 50 by a pair of side trunnions, only one of which, trunnion 52, is shown in FIG. 3 (the other trunnion is located at the opposed side portion of the oblong gimbal ring 50.) The aforesaid arrangement effects a first axis of rotation 54 of the magnetometer 10 as indicated. The end portions of the oblong gimbal ring 50 are rotatably secured to the interior 42 of the aperture in the platform 14 by a similar arrangement of opposed trunnions, only one of which, trunnion 56, is shown in FIG. 3. The latter trunnion arrangement forms a second axis of rotation 58 for the magnetometer 10 as indicated. As may be noted, axes of rotation 54 and 58 are mutually orthogonal and form a coordinate system that is independent of rotation of the base 20.

Hexagonal clamping nuts 60 secure a cap 62 to the top portion of the magnetometer 10. The cap 62 includes a hexagonal pin 64 that projects from its geometric center (which lies along the optical axis of the magnetometer 10.) A cylindrical sleeve 66, locked to the exterior of the pin 64, provides a circular external surface movable within the guide slot 22. A sheet of elastomeric material forms a pad 68 that interfaces the strip 18 at its upper surface and the top of the cap 62 at its lower surface. A hole therein permits passage of the cylindrical sleeve 66.

To retain a preselected tilt of the magnetometer 10, the angular position of the sleeve 66 must be maintained during rotation of the strip. A pair of butterfly locks 70 and 72, which are secured to the pad 68 at opposed sides of the sleeve 66 by means of screws 74 and 76, respectively, are provided for this purpose. The position of the cylindrical sleeve 66 within the slot 22 and, hence, the tilt of the magnetometer 10, can be adjusted manually or with the aid of either mechanical, electromechanical or electronic apparatus by the application of sufficient force to cause the aforementioned combination of elements to a new tilt position. After the new position has been achieved, the compressive forces exerted upon the hemispherical strip 18 by the butterfly locks 70 and 72 and pad 68 and those exerted by the edges of the butterfly locks 70 and 72 against the cylindrical sleeve 66 prevent pivotal movement of the magnetometer 10 within the slot 22.

A feature of the mode of engagement of the sleeve 66 to the hemispherical strip 18 is the small spacing of the inner edges of the slot 22 and of the butterfly locks 70 and 72 from the circumference of the cylindrical sleeve 66. As a result, the cap 62 of the magnetometer 10 can slip within the slot 22 and resist rotation as the base 20 is rotated. In operation, the angle between the local magnetic field vector and the optical axis of the magnetometer is determined either from preselected data or empirically so that the local field vector is approximately coincident with a ray of the cone of maximum sensitivity of the magnetometer 10 when the magnetometer 10 is tilted in the magnetic meridional plane. Assuming that an aerial survey or mapping is to be made, the slot 22 of the hemispherical strip 18 is maintained in alignment with the magnetic meridional plane as the heading of the aircraft changes by rotations of the ring-like base 20 in response to the rotations of the drive gear 27 that are transmitted by the drive belt 24. Proper rotation of the drive gear 27 may be achieved by configuring the mechanism of the drive gear to be responsive to various indicators of aircraft heading. Otherwise, the gear wheel 27 may be adjusted manually by a person who is observing the aircraft's various controls that indicate heading.

As the base 20 is rotated, the gimbal mechanism that holds the magnetometer 10 does not rotate. Rather, this mechanism and, consequently, the magnetometer is limited in movement to tilting movements about the axes 54 and 58. As mentioned above, the top of the magnetometer 10, which is pivoted about the orthogonal gimbal axes, will slip, at the fixed preselected tilt angle, within the guide slot 22 as the hemispherical strip 18 is rotated as a result of the "play" existing between the cylindrical sleeve 66 and the hemispherical strip 18. Thus, repointing of the magnetometer 10 is achieved by tilting it about orthogonal fixed axes thereby bending the associated cable rather than twisting it about its optical axis. In this way, the magnetometer 10 is repointed with minimal force since the substantial resistance to twisting due to the character of the associated cable that is coincident with the longitudinal optical axis of the magnetometer 10 need not be overcome.

Thus it is seen that there has been brought to the measurement arts new and improved apparatus for continuously orienting a magnetometer in such a way that the magnitude of a local magnetic field may be measured with maximum sensitivity despite changes in the heading of the vehicle carrying the magnetometer with respect to the magnetic meridional plane.

What is claimed is:

1. Apparatus for measuring the earth's magnetic field comprising, in combination:
    (a) an optical magnetometer having an optical axis, the optimum measurement sensitivity of said magnetometer being defined by a cone of predetermined angle that is symmetric about said optical axis;
    (b) a planar platform having an aperture for accommodating said magnetometer;
    (c) means for engaging said magnetometer to said platform; said means including (i) an inner ring for securing said magnetometer with its optical axis at right angles to the plane of said ring and (ii) an outer ring, said outer ring being pivotally engaged to said platform to define an axis of rotation in the plane of said platform and being pivotally engaged to said inner ring to define an axis of rotation orthogonal to said last named axis;
    (d) a guide for restraining one end of said magnetometer to set it at a preselected tilt angle; and
    (e) means located in the plane of said platform for rotating said guide whereby the optical axis of said magnetometer is constrained to be in the magnetic meridional plane so that one element of the cone of optimum detection of said magnetometer is always coincident with the magnetic field vector.

2. Apparatus as defined in claim 1 wherein said guide comprises an arcuate strip having an internal slot.

3. Apparatus as defined in claim 2 wherein said means for angularly orienting said guide is further characterized in that:
    (a) said strip is fixed to a ring-like base; and
    (b) said means for rotating said guide additionally includes means for rotating said base.

4. Apparatus as defined in claim 3 further characterized in that:
    (a) said base includes a peripheral array of gear teeth; and
    (b) said means for rotating said base includes a belt having a plurality of teeth for engaging said base.

5. Apparatus as defined in claim 4 wherein said means for rotating said base includes a servomechanism to drive said belt.

6. Apparatus as defined in claim 4 wherein said outer ring is substantially oval.

7. Apparatus for positioning an optical magnetometer comprising, in combination:
    (a) a planar platform having an aperture;
    (b) means for engaging a magnetometer to said platform, said means including (i) an inner ring for securing a magnetometer and (ii) an outer ring, said outer ring being pivotally engaged to said platform to define a tilting axis of rotation in the plane of said platform and being pivotally engaged to said inner ring to define another axis of tilting rotation orthogonal to said last-named axis;

(c) a guide for restraining one end of a magnetometer to set it at a preselected tilt angle; and (d) means located in the plane of said platform for rotating said guide whereby the optical axis of a magnetometer is constrained to lie in the magnetic meridional plane so that one element of the cone of optimum detection of the magnetometer is always coincident with the magnetic field vector.

8. Apparatus as defined in claim 7 wherein said guide comprises an arcuate strip having an internal slot.

9. Apparatus as defined in claim 8 wherein said guide is further characterized in that:

(a) said strip is fixed to a ring-like base; and (b) said means for rotating said guide additionally includes means for rotating said base.

10. Apparatus as defined in claim 9 further characterized in that:

(a) said base includes a peripheral array of gear teeth; and (b) said means for rotating said base includes a belt having a plurality of teeth for engaging said base.

11. Apparatus as defined in claim 10 wherein said means for rotating said base includes a servomechanism to drive said belt.

12. Apparatus as defined in claim 10 wherein said outer ring is substantially oval.

* * * * *